US008554162B2

(12) United States Patent
Lindstrand et al.

(10) Patent No.: US 8,554,162 B2
(45) Date of Patent: Oct. 8, 2013

(54) HIGH EFFICIENCY POWER AMPLIFIER

(75) Inventors: Jonas Lindstrand, Lund (SE); Carl Bryant, Lund (SE); Henrik Sjöland, Löddeköpinge (SE)

(73) Assignee: ST-Ericsson SA, Plan-les-Ouates (CH)

( * ) Notice: Subject to any disclaimer, the term of this patent is extended or adjusted under 35 U.S.C. 154(b) by 219 days.

(21) Appl. No.: 13/197,022

(22) Filed: Aug. 3, 2011

(65) Prior Publication Data
US 2013/0033321 A1 Feb. 7, 2013

(51) Int. Cl.
*H01Q 11/12* (2006.01)
*H04B 1/04* (2006.01)
*H03F 3/45* (2006.01)
*H03F 3/16* (2006.01)

(52) U.S. Cl.
USPC ................ 455/127.1; 455/552.1; 330/252; 330/277

(58) Field of Classification Search
USPC ............ 455/118, 127.1, 127.2, 552.1, 553.1; 330/252, 253, 277; 375/296, 297
See application file for complete search history.

(56) References Cited

U.S. PATENT DOCUMENTS

| | | | |
|---|---|---|---|
| 6,535,069 B2 * | 3/2003 | Fujioka et al. | 330/302 |
| 7,276,976 B2 * | 10/2007 | Oh et al. | 330/311 |
| 7,339,433 B2 * | 3/2008 | Bhatacharya et al. | 330/257 |
| 7,509,102 B2 * | 3/2009 | Rofougaran et al. | 455/127.1 |
| 7,656,249 B2 * | 2/2010 | Fukuda et al. | 333/33 |
| 7,889,003 B2 * | 2/2011 | Basten | 330/251 |
| 2007/0126505 A1 | 6/2007 | Bockelman et al. | |

FOREIGN PATENT DOCUMENTS

WO 2009060095 A1 5/2009

OTHER PUBLICATIONS

Apostolidou, M. et al., "A 65nm CMOS 30dBm Class-E RF Power Amplifier With 60% Power Added Efficiency", 2008 IEEE Radio Frequency Integrated Circuits Symposium, 2008, pp. 141-144; Eindhoven, Netherlands.
Razavi, Behzad, "A Study of Injection Locking and Pulling in Oscillators", IEEE Journal of Solid-State Circuits, vol. 39, No. 9, Sep. 2004, pp. 1415-1424, University of California, Los Angeles, CA.
Hong, J. et al., "A 2.4 GHz Fully Integrated CMOS Power Amplifier Using Capacitive Cross-Coupling", Wireless Information Technology and Systems (ICWITS), 2010 IEEE International Conference on, IEEE, Piscataway, USA, Aug. 28, 2010, pp. 1-4, XP317825536A.

(Continued)

*Primary Examiner* — Quochien B Vuong
(74) *Attorney, Agent, or Firm* — Coats & Bennett, P.L.L.C.

(57) ABSTRACT

A power amplifier circuit utilizes a cross-coupled tapped cascade topology together with a technique of applying an RF injection current into a wideband node to provide a single-stage power amplifier with improved PAE, output power, and gain over a wide RF band. The amplifier circuit comprises a cross-coupled cascade transistor unit comprising a pair of cross-coupled cascade transistors, a cross-coupled switching transistor unit comprising a pair of cross-coupled switching transistors, and an RF current generator. RF current generator generates a differential RF injection current, while switching transistor unit amplifies the injection current to generate an amplified injection current at the wideband node of the amplifier circuit and the cascode transistor unit further amplifies the injection current to generate the desired amplified signal at the output of the amplifier circuit. The output signal amplitude generally depends on the differential injection current and the supply voltage $V_{DD}$ applied to the power amplifier circuit.

17 Claims, 13 Drawing Sheets

(56) References Cited

OTHER PUBLICATIONS

Boos, Z. et al., "A Fully Digital Multimode Polar Transmitter Employing 17b RF DAC in 3G Mode", International Solid-State Circuits Conference Digest of Technical Papers (ISSCC), Feb. 20, 2011, pp. 376-378, XP32013780A.

Galal, S. et al., "10-Gb/s Limiting Amplifier and Laser/Modulator Driver in 0.18-μm CMOS Technology", Solid-State Circuits, IEEE Journal, vol. 38, Issue 12, Dec. 1, 2003, pp. 2138-2146, XP11104262A.

Phan, A. et al., "A Novel LC T-Structure Filter Integrated with CMOS Mixer for Image Rejection", Intelligent Signal Processing and Communication Systems, Proceedings of 2004 International Symposium on, Nov. 18, 2004, pp. 758-761, IEEE, Seoul, South Korea, XP10806078A.

Tsai, King-Chun et al., A 1.9GHz 1W CMOS Class E Power Amplifier for Wireless Communications, Department of Electrical Engineering and Computer Sciences, University of California, Berkeley, CA, USA, IEEE Journal of Solid-State Circuits, Sep. 22-24, 1998, pp. 76-79.

\* cited by examiner

HIGH EFFICIENCY POWER AMPLIFIER

The invention described herein generally relates to amplifiers, and more particularly relates to power amplifiers for wireless communication devices.

BACKGROUND

Current wireless technology trends towards increasing numbers of wireless standards and radio frequency (RF) bands to support wireless communications have led to the development of multi-standard, multi-band cellular systems. Such efforts have produced well-performing wideband receivers and frequency synthesizers. However, power amplifiers having the desired performance, e.g., Power-Added Efficiency (PAE), output power, etc., across the multiple frequency bands remains a challenge for such cellular systems.

While various groups have attempted to solve this problem, the results generally do not provide sufficient efficiency across a wide frequency band, undesirably require multiple amplifier stages, do not provide wideband operation, etc. For example, "A Polyphase Multipath Technique for Software-Defined Radio Transmitters" by R. Shrestha, E. A. M. Klumperink, E. Mensink, G. J. M. Wienk, and B. Nauta (*IEEE J. Solid-State Circuits*, vol. 41, no. 12, pp. 2681-2692, 2006) provides a wideband solution, but the output power is insufficient and the efficiency across the wideband is low relative to single band amplifiers. "A 1.9 GHz 1 W CMOS Class E Power Amplifier for Wireless Communications" by K. C. Tsai and P. R. Gray (*ESSCIRC*, pp. 76-79, 1998), referred to herein as the Tsai solution, and "A 29 dBm 70.7% PAE Injection-Locked CMOS Power Amplifier for PWM Digitized Polar Transmitter" by J. Paek and S. Hong (*Microwave and Wireless Components Letters*, vol. 20, no. 11, pp. 637-639, 2010), referred to herein as the Paek solution, provide alternative solutions using injection-locked power amplifiers. These solutions, however, require multiple amplifier stages and have not shown wideband frequency operation. Another solution, "A 65 nm CMOS 30 dBm Class-E RF Power Amplifier with 60% Power Added Efficiency" by M. Apostolidou, M. P. van der Heijden, D. M. W. Leenaerts, J. Sonsky, A. Heringa, and I. Volokhine (*Radio Frequency Integrated Circuits Symposium*, pp. 141-144, 2008), referred to herein as the Apostolidou solution, provides a wideband solution with improved PAE and output power, but requires multiple amplifier stages, which undesirably increases the chip area and power consumption of the amplifier.

Thus, there remains a need for an improved power amplifier useful in wideband RF scenarios.

SUMMARY

The power amplifier circuit disclosed herein utilizes a cross-coupled tapped cascode topology together with a technique of applying an RF injection current into a wideband node to provide a single-stage power amplifier with improved PAE, output power, and gain over a wide radio frequency band. It will be appreciated that while the power amplifier disclosed herein may be used for wideband operations, the power amplifier also provides high efficiency, output power, and gain for narrower frequency band applications.

The power amplifier circuit comprises a current generator, a pair of cross-coupled switching transistors, a pair of cross-coupled cascode transistors, and first and second tap capacitors. The current generator is configured to generate a radio frequency differential injection current at a differential current generator output based on an input signal. The input signal may comprise any one of an analog input voltage signal at the radio frequency, or a baseband input signal, e.g., an analog or digital baseband input signal. The switching transistors each include a source node, a gate node, and a drain node, and are cross-coupled such that the drain node of one switching transistor couples to the gate node of the other switching transistor. Further, the drain nodes of the switching transistors are coupled to the differential current generator output to receive the differential injection current. The cascode transistors each include a source node, a gate node, and a drain node, and are cross-coupled such that the drain node of one cascode transistor couples to the gate node of the other cascode transistor. The cross-coupled cascode transistors are configured to generate a differential amplified output signal at the drain nodes of the cascode transistors based on a supply voltage operatively coupled to the drain node of the cascode transistors and the differential injection current applied to the source node of the cascode transistors. The first and second tap capacitors couple to the respective gate nodes of the cascode transistors. In one embodiment, the tap capacitors have a capacitance selected to control the amplitude of a gate signal at the gate nodes of the cascode transistors to substantially equal the amplitude of a source signal at the corresponding source nodes of the cascode transistors. As used herein, substantially equal could mean equal, but more likely means that the amplitude of the gate signals at the gate nodes of the cascode transistors has some deviation, e.g., deviates within a certain range around the amplitude of the source signals at the corresponding source nodes of the cascode transistors. The deviation range might, for example, be 10%. In other embodiments, the deviation range might be 5% in some cases, 2% in other cases, 20% in other cases, 50% in other cases, or any value in between, depending on the specific components values or operating conditions of the circuit. Preferably, this deviation range is over the entire dynamic range of the amplifier circuit. Nevertheless, there may be intervals where the deviation range is larger. The total length of such intervals preferably makes up no more than 20% of the entire dynamic range, but in some cases, a total interval length of, e.g., 10% or 5% or 2% might be required.

DETAILED DESCRIPTION

Figure 1:
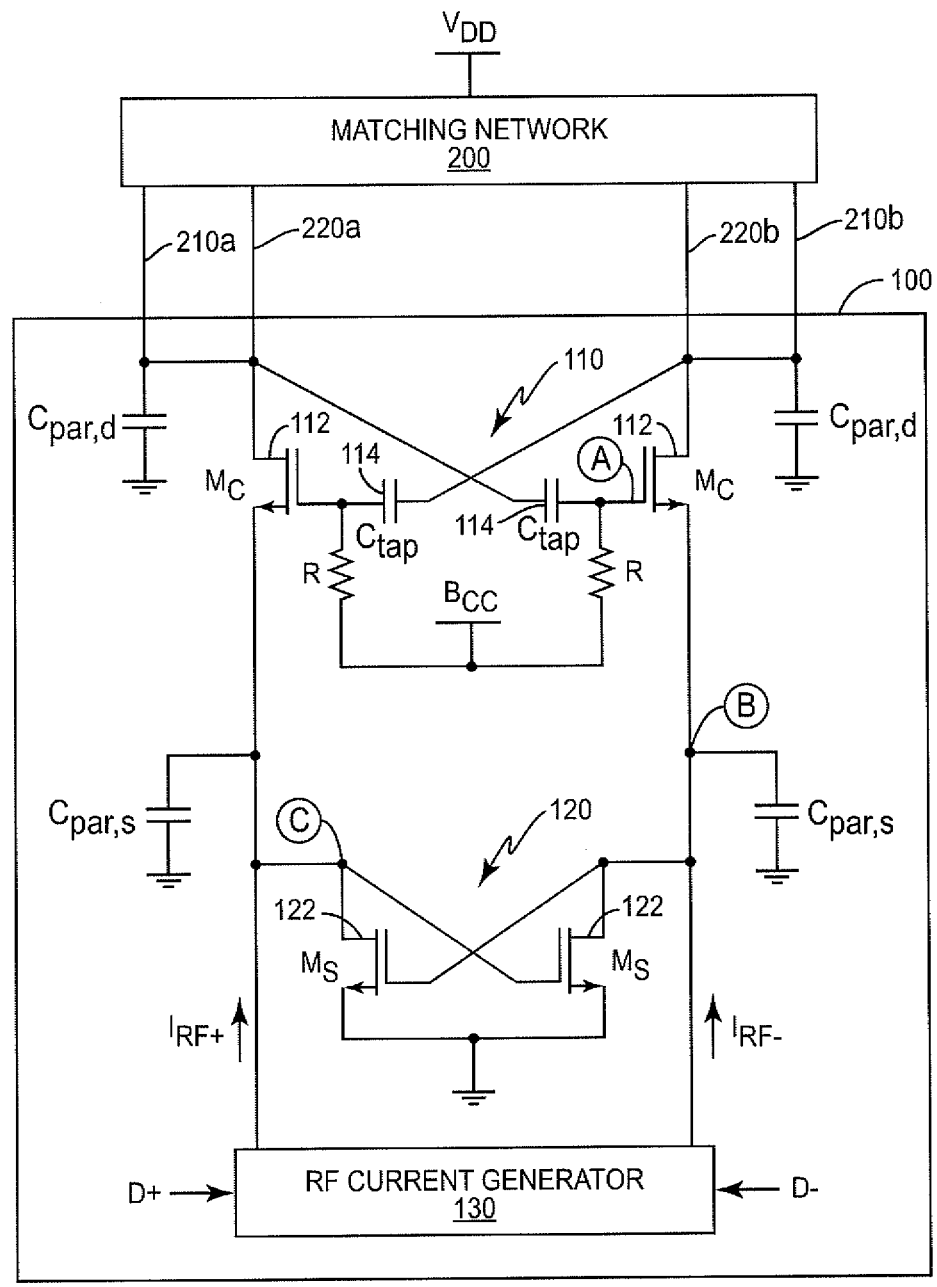
FIG. 1 depicts a power amplifier circuit according to one exemplary embodiment.

The power amplifier disclosed herein comprises a single-stage amplifier that utilizes a cross-coupled tapped cascode topology together with a technique of applying an RF injection current into a wideband node to provide a single-stage power amplifier. In one embodiment, the power amplifier exhibits a 64% peak PAE, 29 dBm output power, and a 20.5 dB gain over a 2 GHz radio frequency band. FIG. 1 shows one exemplary embodiment of a power amplifier circuit 100 configured to achieve these results. Amplifier circuit 100 comprises a cross-coupled cascode transistor unit 110 comprising a pair of cross-coupled cascode transistors 112, a cross-coupled switching transistor unit 120 comprising a pair of cross-coupled switching transistors 122, and an RF current generator 130. Broadly, the RF current generator 130 generates a differential RF injection current based on a differential input signal. Switching transistor unit 120 amplifies the injection current to generate an amplified injection current at the wideband node of the amplifier circuit, i.e., the source nodes of the cascode transistors 112. Cascode transistor unit 110 further amplifies the injection current to generate the desired amplified signal at the output 220 of the amplifier circuit 100, e.g., at the drain nodes of the cascode transistors 112. The amplitude of the output signal generally depends on the differential injection current and the supply voltage $V_{DD}$ applied to the power amplifier circuit 100. As shown in FIG. 1, a matching network 200 may be coupled to the output 220 of the amplifier circuit 100 to match the impedance of the amplifier circuit 100 to that of an external element, e.g., an antenna (not shown). While not required, it will be appreciated that the supply voltage $V_{DD}$ may be applied to the power amplifier circuit 100 via the matching network 200, as shown in FIG. 1. It will be appreciated that the transistors used to implement the power amplifier circuit 100 may comprise any known type of transistor, including but not limited to, NMOS, CMOS, BiCMOS, HBT, and III-V technology (including Bipolar and FET) transistors.

Figure 2:
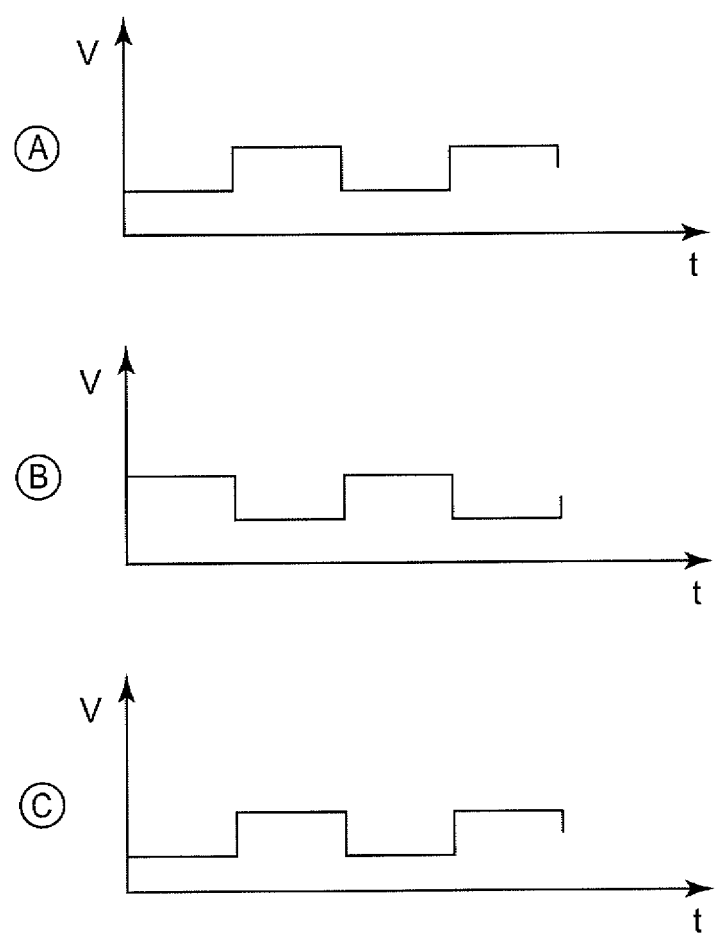
FIG. 2 depicts signal diagrams for the signals at selected points of the power amplifier circuit of FIG. 1.

The improved operation of the amplifier circuit 100 relies on the cross-coupled configurations of the transistor units 110, 120 and the tap capacitors 114 of the cascode transistor unit 110. As shown in FIG. 2 and explained in more detail herein, this configuration causes a signal B at the source node of a cascode transistor 112 to have the same amplitude as, but be out-of-phase from, both a signal A at the gate node of the same cascade transistor 112 and a signal C at a drain node of the opposite switching transistor 122. To further explain the details of the power amplifier circuit 100, the following description considers each of the RF current generator 130, switching transistor unit 120, and cascode transistor unit 110 separately.

RF current generator 130 generates a differential injection current $I_{RF+}$, $I_{RF-}$ based on a differential input signal $D_+$, $D_-$. FIGS. 3-6 depict various embodiments of exemplary RF current generators 130. It will be appreciated, however, that current generators other than those shown herein may also be used.

Figure 3:
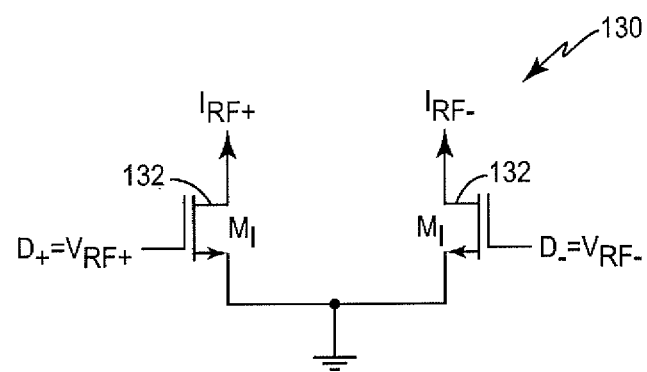
FIG. 3 depicts a circuit diagram for an RF current generator according to one exemplary embodiment.

The RF current generator 130 depicted in FIG. 3 comprises a pair of injection transistors 132 configured to generate the RF differential injection current at the drain nodes from an input signal comprising an analog RF differential voltage signal applied to the gate nodes. In this embodiment, the injection transistors 132 are configured to operate as voltage-to-current converters. To provide the RF differential injection current to the rest of the amplifier circuit 100, the drain node of each injection transistor 132 couples to the drain node of the corresponding switching transistor 122 and to the source node of the corresponding cascade transistor 112.

An alternative embodiment of the RF current generator 130 may comprise a mixer configured to generate the RF differential injection current from an RE local oscillator signal and an input signal comprising a baseband differential input signal. In such an embodiment, upconversion to RF takes place inside the amplifier circuit 100, which removes the need for any upconversion outside the amplifier circuit 100. It will be appreciated that implementing upconversion inside the amplifier circuit 100 provides a more linear result, with respect to both upconversion and power amplification. Further, such mixers advantageously eliminate the need for separate RF drivers and other RF circuitry, which generally have high dynamic range requirements.

Figure 4:
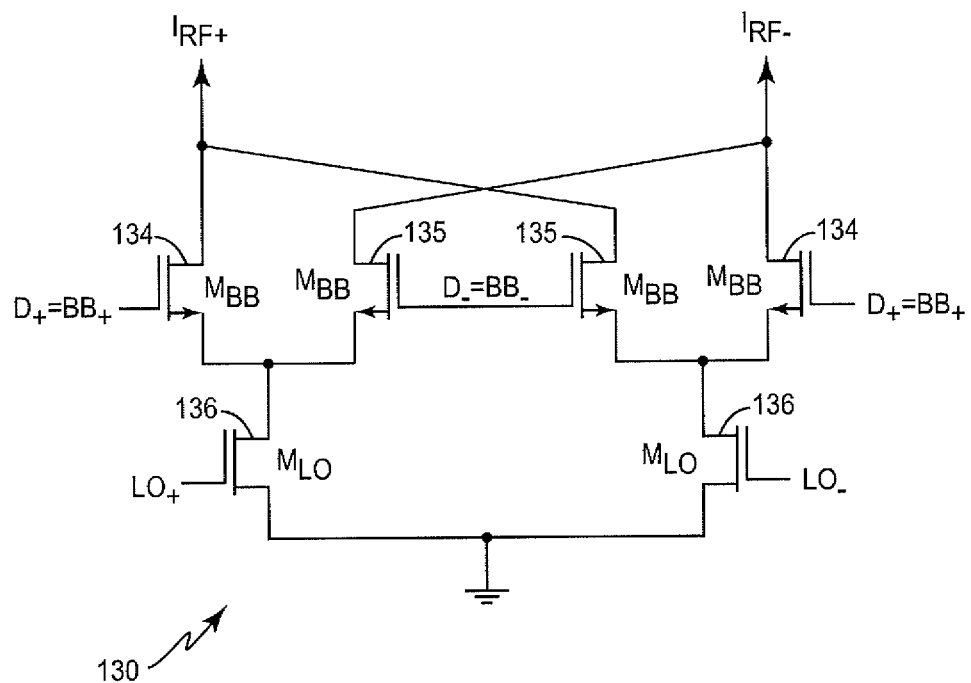
FIG. 4 depicts a circuit diagram for an RF current generator according to another exemplary embodiment.

For example, FIG. 4 depicts an RF current generator 130 comprising a transconductance mixer configured to generate the RF differential injection current at the RF current generator outputs from an RF local oscillator signal (LO) and an input signal comprising a baseband differential input current (BB). The RF current generator 130 of FIG. 4 comprises a first pair of baseband transistors 134, a second pair of baseband transistors 135, and a pair of local oscillator transistors 136, e.g., NMOS transistors 136. The drain node of one of the local oscillator transistors 136 couples to a source nodes of corresponding transistors of the first and second pairs of baseband transistors 134, 135, and the drain node of the other local oscillator transistor 136 couples to the source nodes of the other of the first and second pairs of baseband transistors 134, 135, as depicted in FIG. 4. The drains of the first pair of baseband transistors 134 also cross-couple with the drains of the second pair of baseband transistors 135. The positive input current signal $D_+=BB_+$ is applied to the gate node of each of the first pair of baseband transistors 134 and the negative input current signal $D_-=BB_-$ is applied to the gate node of each of the second pair of baseband transistors 135. The positive and negative local oscillator signals are applied to the gate nodes of respective transistors of the local oscillator transistor pair 136. As a result, the differential baseband input signal is upconverted to the LO frequency to generate the RF differential injection current $I_{RF+}$, $I_{RF-}$ at the drain nodes of the baseband transistors 134, 135.

Figure 5:
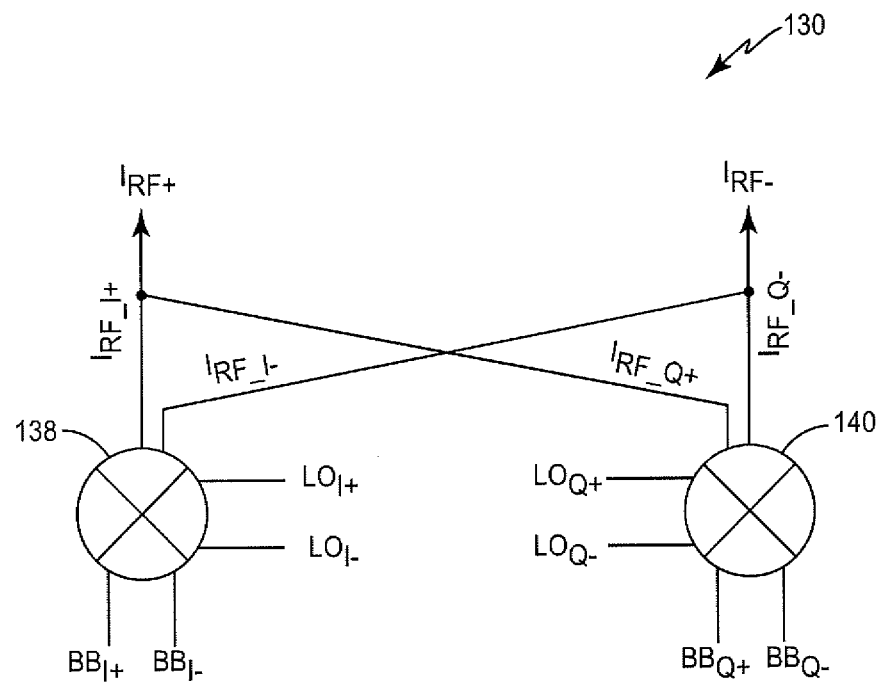
FIG. 5 depicts a circuit diagram for an RF current generator according to another exemplary embodiment.

In another mixer example, the RE current generator 130 comprises a differential Quadrature mixer comprising an In-phase mixing unit 138 and a Quadrature-phase mixing unit 140, as depicted in FIG. 5. In this embodiment, the input signal comprises a baseband input signal having a differential In-phase portion $BB_{I+}$, $BB_{I-}$ and a differential Quadrature-phase portion $BB_{Q+}$, $BB_{Q-}$, where the differential outputs from each mixing unit 138, 140 are cross-coupled to combine the In-phase and Quadrature-phase output portions to provide $I_{RF+}$ at one output and $I_{RF-}$ at the other output. In-phase mixing unit 138 mixes the differential In-phase portion $BB_{I+}$, $BB_{I-}$ with the differential In-phase local oscillator signal to generate the RF differential In-phase current $I_{RF\_I+}$, $I_{RF\_I-}$. Quadrature-phase mixing unit 140 mixes the differential Quadrature-phase portion $BB_{Q+}$, $BB_{Q-}$ with the differential Quadrature-phase local oscillator signal to generate the RF differential Quadrature-phase current $I_{RF\_Q+}$, $I_{RF\_Q-}$. The differential outputs from each mixing unit 138, 140 are cross-coupled to combine the output positive In-phase and Quadrature-phase portions, $I_{RF\_I+}$ and $I_{RF\_Q+}$, to provide $I_{RF+}$ at one output, and to combine the output negative In-phase and Quadrature-phase portions, $I_{RF\_I-}$ and $I_{RF\_Q-}$, to provide $I_{RF-}$ at the other output.

Figure 6:
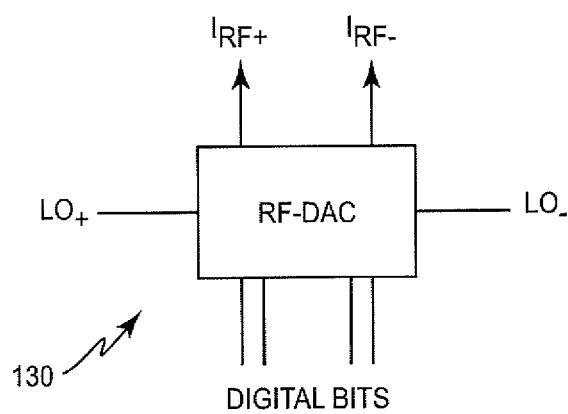
FIG. 6 depicts a circuit diagram for an RF current generator according to another exemplary embodiment.

In still another mixer example depicted in FIG. 6, the RF current generator 130 comprises an RF digital-to-analog converter/mixer. In this embodiment, the input signal comprises a digital baseband input signal, and the RF current generator 130 upconverts the bits of the digital baseband input signal based on the an RF local oscillator signal to generate the RF differential injection current $I_{RF+}$, $I_{RF-}$. One exemplary RF digital-to-analog converter is disclosed in "A fully Digital Multimode Polar Transmitter Employing 17b RF DAC in 3G Mode" by Boos et al., and published at ISSCC 2011, Session 21, Cellular 21.7 (978-1-61284-302-5/11), which is incorporated herein by reference. This exemplary RF digital-to-analog converter employs 10 thermometer and 4 binary-coded bits with a high oversampling, using a GHz range clock, and providing overall 17b DAC resolution in 3G mode, and 19b in EDGE mode. It will be appreciated that other RF digital-to-analog converters may also be used.

Referring back to FIG. 1, the cascode transistor unit 110 and switching transistor unit 120 are described. Cascade transistor unit 110 comprises a pair of cascode transistors 112 cross-coupled between the drain nodes and a pair of tap capacitors $C_{tap}$ 114 at the gate nodes. The tap capacitors 114 are applied to the gate nodes to perform voltage division with the gate node capacitance (inherent in the gate node) to reduce the gate voltage swing. To that end, the tap capacitors 114 have a (matched) capacitance selected to control the signal from the cross-coupled drain nodes applied to the gate nodes, so that the amplitude of the gate node signal substantially equals the amplitude of the signal at the corresponding source node, or to differ from the amplitude of the source signal at the corresponding source node by no more than 50%. This voltage division protects the cascode transistors 112 from oxide overvoltage, reduces the capacitive loading of the matching network 200, and enables the desired amount of loop-gain to be provided for self-oscillation. The cross-coupling between the cascode transistors 112 flips the phase of the signals applied to the gate nodes, e.g., by 180°. As a result, the amplitudes at the gate and source nodes may be substantially equal, but the signals at these nodes are out of phase. This results in only half of the charges due to the parasitic capacitances $C_{par,s}$ being dissipated to ground, e.g., the signal ground, as compared to a classic cascade structure. Further, this configuration reduces the signal swing and the impedance of the source nodes of the cascode transistors 112, which relaxes both voltage stress and output power requirements of the switching transistors 122. Further still, using a cross-coupled tapped cascade transistor structure, as depicted in FIG. 1, ensures that the swing at the gate node of the cascode transistors 112 tracks the output at the drain nodes over the entire bandwidth.

The switching transistor unit 120 comprises a pair of switching transistors 122 cross-coupled between the drain and gate nodes. The differential current output by the drain nodes of the cross-coupled switching transistors 122 increases the injection current $I_{RF}$, which leads to a wider locking range at a wideband node of the power amplifier circuit 100, i.e., the source nodes of the cascode transistors 112. Further, when the switching transistors 122 are on (e.g., when the output power exceeds some threshold) the majority of the injection current conducts through the cascode transistors 112. When the output power is low (e.g., below the threshold) the switching transistors 122 are off. When the RF current generator 130 comprises the injection transistors 132 of FIG. 3, the cross-coupled configuration of the switching transistors enables the size of the injection transistors 132 to be reduced as long as the injection transistors 132 remain large enough so that the switching transistors 122 maintain a switching mode of operation.

The wideband impedance at the source node of the cascade transistors 112 combined with the switching properties of the switching transistors 122 (and in some cases, the injection transistors 132) provides square-wave current and voltage signals with steep edges at the source nodes of the cascode transistors 112. Because the voltage and current are not high simultaneously except during injection by the current generator 130, the resulting losses due to the switching transistor unit 120 and current generator 130 are dominated by the injection current output by RF current generator 130.

As shown in FIG. 1, the power amplifier circuit 100 may be coupled to a matching network 200 configured to match the output impedance of the amplifier circuit 100 to that of an external load (not shown). FIGS. 7-10 depict exemplary matching networks 200. It will be appreciated that the present invention is not limited to the depicted matching networks 200.

Figure 7:
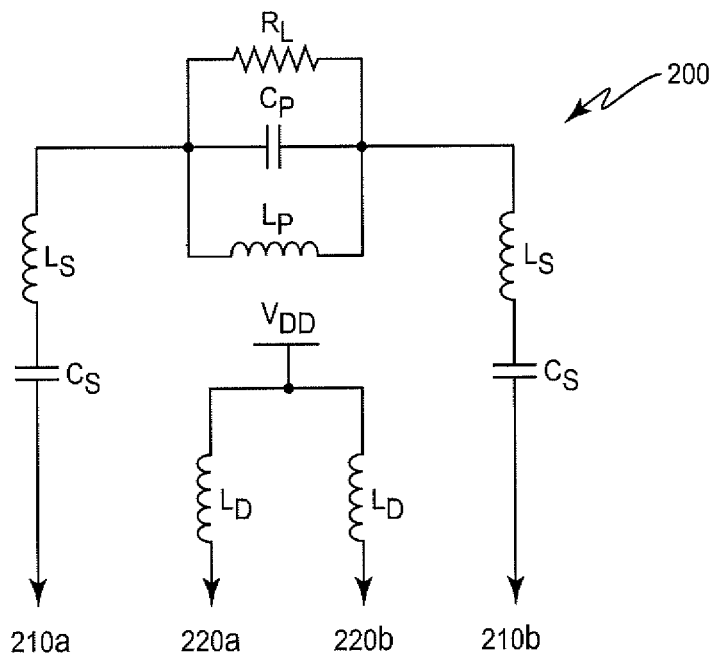
FIG. 7 depicts a circuit diagram for a matching network according to one exemplary embodiment.

FIG. 7 depicts one exemplary matching network 200 comprising the load, represented by $R_L$, $C_P$, and $L_P$, and the reactive components represented by $L_S$, $L_D$, and $C_S$. $L_S$ and $C_S$ are connected as a series resonance circuit with the external load, which results in a negative (capacitive) reactance for low frequencies and a positive (inductive) reactance for high frequencies. $L_D$ comprises a current source. At low frequencies $L_D$ is a short, while at high frequencies, $C_{par,d}$ (in the amplifier circuit 100) is a short. Thus, reactive components $L_D$ and $C_{par,d}$ set the limit for of the bandwidth over which the power amplifier can be efficient using the matching network 200 of FIG. 7.

Figure 8:
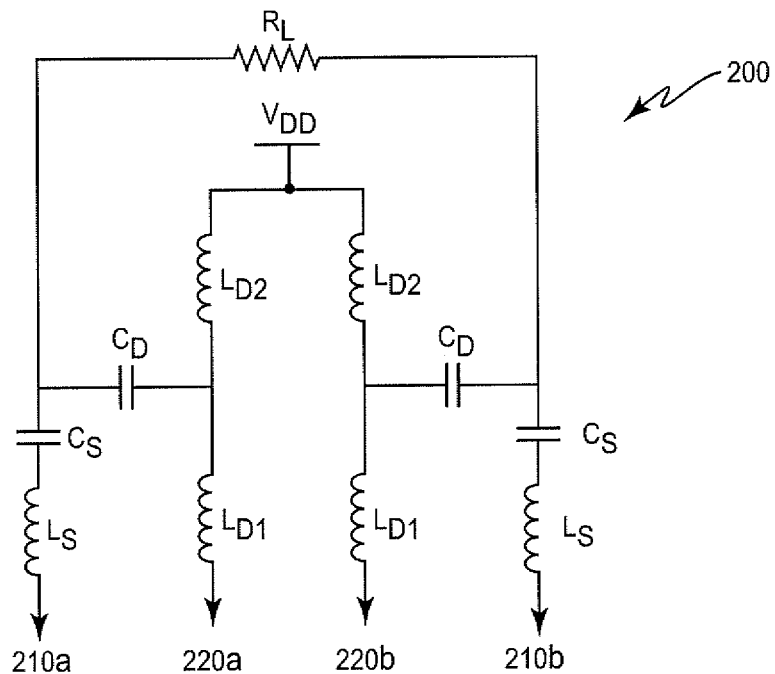
FIG. 8 depicts a circuit diagram for a matching network according to another exemplary embodiment.

In some embodiments, it may be desirable to provide generally constant impedance to the drain nodes of the cascode transistors across a wide range of frequencies. As used herein, generally constant could mean actually constant, but it is more likely that the impedance has some variation, having for example no more than a 5% variation over the required or desired wideband frequency range. In other cases, a 1% might be required, while in still other cases 2%, 10%, 20%, or anything in between is acceptable. The acceptable variation might be affected by the specific components, values, or operating conditions of the circuit. Preferably, the limited variation applies over the entire required or desired wideband frequency range. Nevertheless, there may be frequency intervals where a larger variation is acceptable. The total length of such intervals preferably makes up no more than 20% of the required or desired wideband frequency range. In some cases, however, a total interval length relative to the wideband frequency range of 10%, 5%, 2%, 1%, or anything in between might be required. FIG. 8 depicts an alternative higher order matching network 200 configured to provide a generally constant impedance. In this embodiment, the matching network 200 comprises a load represented by $R_L$, and reactive components represented by $C_S$, $L_S$, $L_{D1}$, $L_{D2}$, and $C_D$. In the matching network 200 of FIG. 8, a first reactance unit comprises $L_{D1}$ and $L_{D2}$, which are serially coupled between signal ground, which may, e.g., correspond to the supply voltage $V_{DD}$, and each of the drain nodes of the cascode transistor unit 110. A second reactance unit comprises $C_S$ and $L_S$ serially coupled between a load resistor $R_L$ and each of the drain nodes of the cascode transistor unit 110. A third reactance unit comprises at least one capacitor $C_D$ coupled at one node between $R_L$ and $C_S$, and at the other node between the inductors $L_{D1}$ and $L_{D2}$ of the first reactance unit. The inductors of the first reactance unit generate a first high positive reactance at low frequencies, which keeps the losses low, even for low frequencies, where a single inductor is considered to be a short, and a second positive reactance at high frequencies. The second reactance unit generates a negative reactance at low frequencies and third high positive reactance at high frequencies. As the operating frequency increases, $C_{par,d}$ (in the amplifier circuit 100) goes towards a short, which leads to increased power consumption. By decreasing the reactance between the drain nodes of the cascode transistors 112, e.g., by using the capacitor(s) $C_D$ of the third reactance unit, which short at higher frequencies, the effect of $C_{par,d}$ decreases (it is effectively cancelled). Such reactance properties yield higher impedances at the drains of the cascode transistors 112, and therefore, widen the bandwidth and efficiency with respect to frequency.

Figure 9:
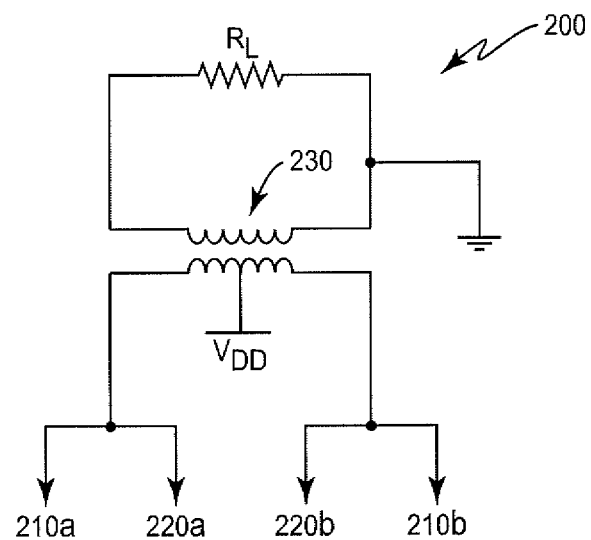
FIG. 9 depicts a circuit diagram for a matching network according to another exemplary embodiment.
Figure 10:
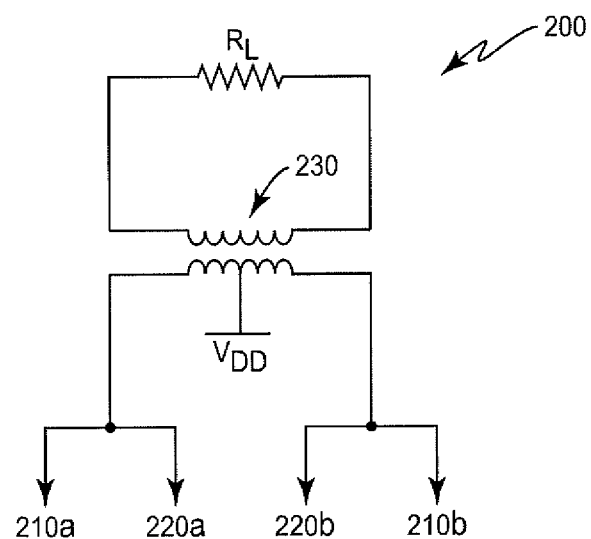
FIG. 10 depicts a circuit diagram for a matching network according to another exemplary embodiment.
Figure 11A:
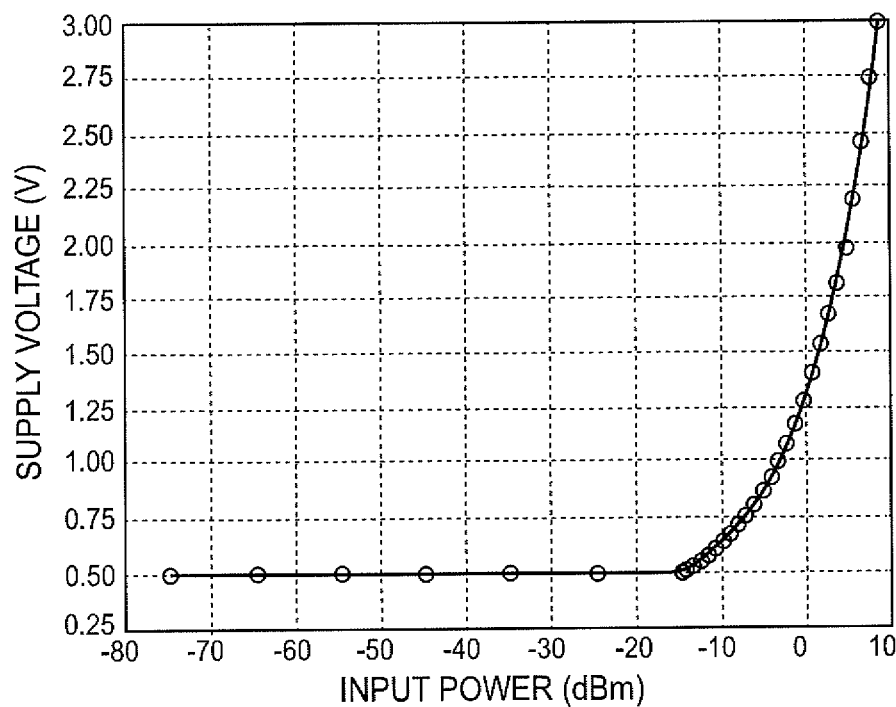
FIGS. 11A and 11B respectively depict supply voltage and cascode bias vs. input power for the amplifier circuit comprising the components of FIGS. 1, 3, and 7.
Figure 11B:
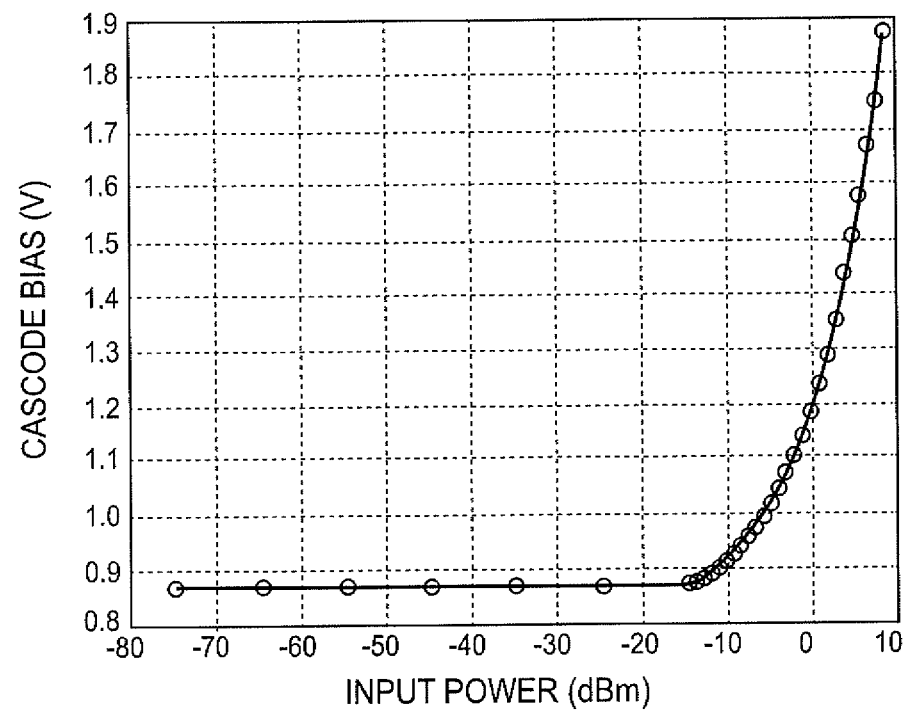

FIGS. 9 and 10 depict other exemplary matching networks 200 comprising a transformer 230. In FIG. 9, the transformer 230 is configured as a balun, where one side of the transformer is differentially connected to the power amplifier circuit 100 and the other side connects to the load $R_L$ in a single-ended manner. In FIG. 10, one side of the transformer is differentially connected to the power amplifier circuit 100 while the other side differentially connects to the load $R_L$. The performance of the matching networks 200 in FIGS. 9 and 10 is generally the same, and is generally comparable to that of the matching networks 200 of FIGS. 7 and 8. In addition, because the matching network 200 of FIG. 10 is not a balun, an additional balun would be needed before the antenna for this embodiment.

FIGS. 11-16 depict various simulation results for exemplary embodiments of the power amplifier disclosed herein. For example, FIGS. 11-14 depict parameter and performance results for a power amplifier configuration comprising the power amplifier circuit 100 of FIG. 1, the RF current generator 130 of FIG. 3, and the matching network 200 of FIG. 7. FIGS. 11A and 11B respectively show the supply voltage ($V_{DD}$) and cascode bias voltage ($B_{cc}$) with respect to input power. For lower output power levels (linear operating mode), the supply voltage was kept constant at 0.48 V. As the input power increased, the supply voltage was increased to allow more headroom for the output signal. As depicted in FIG. 11A, the supply voltage is 3.0 V at the peak input power. FIG. 11B shows that the cascode bias voltage has similar characteristics to the supply voltage, except that the values go from 0.865 V for the linear mode of operation to a maximum bias of 1.9 V.

Figure 12:
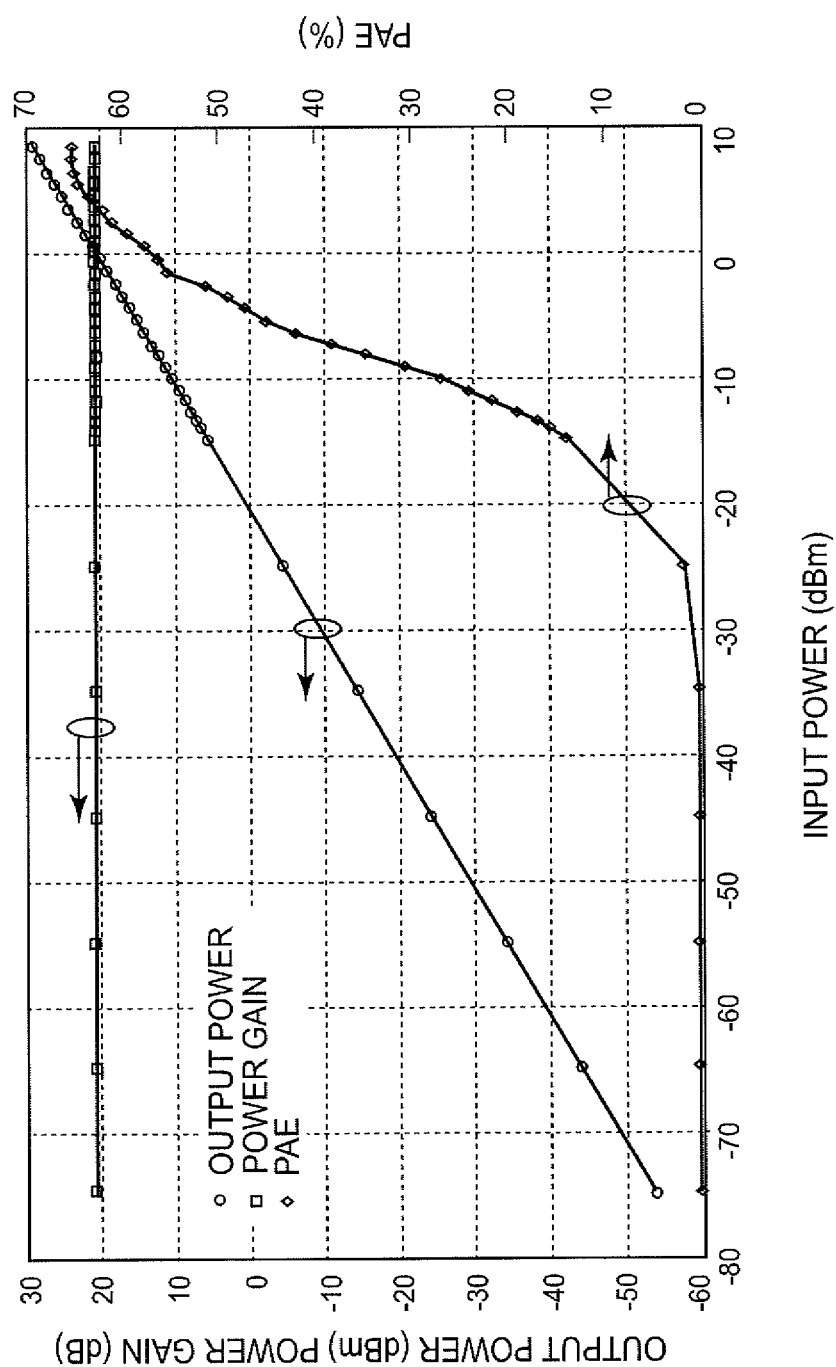
FIG. 12 depicts output power, power gain, and PAE vs. input power for the amplifier circuit comprising the components of FIGS. 1, 3, and 7.

FIG. 12 depicts the output power, gain, and PAE results as a function of the input power at 2 GHz. As shown in FIG. 12, the output power tracks the input power linearly, which is also demonstrated by the flat gain response. The PAE peaks at 64%. When the input power is backed off by 16 dB, the PAE reduces to 37%. Considering the power range, FIG. 12 demonstrates that the power amplifier operates over more than an 80 dB range, which satisfies WCDMA requirements.

Figure 13A:
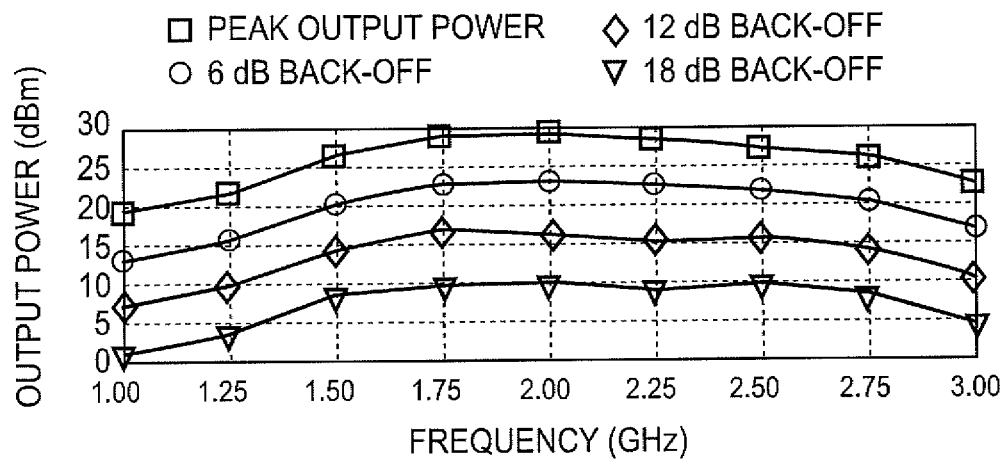
FIGS. 13A and 13B respectively depict output power and PAE vs. frequency for the amplifier circuit comprising the components of FIGS. 1, 3, and 7.
Figure 13B:
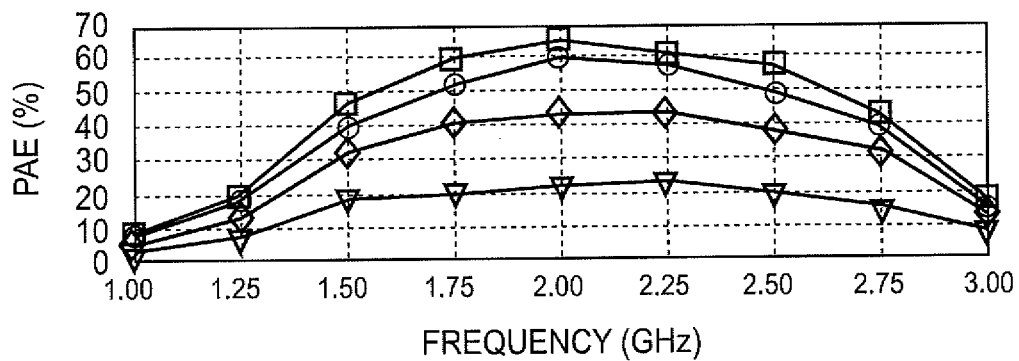

FIGS. 13A and 13B depict the frequency response for the output power and PAE for different input powers. At peak output power, FIG. 13A demonstrates that the −3 dB bandwidth of the power amplifier circuit 100 is 1.2 GHz (between 1.4 and 2.6 GHz). FIG. 13A further demonstrates that the bandwidth increases for lower input powers. Further, FIG. 13B demonstrates that the PAE at the peak output power is above 50% between 1.6 GHz and 2.6 GHz. When the output power is backed off by 18 dB, the PAE is at a constant value of 20% for in band frequencies, and rolls off quickly outside the bandwidth.

Figure 14A:
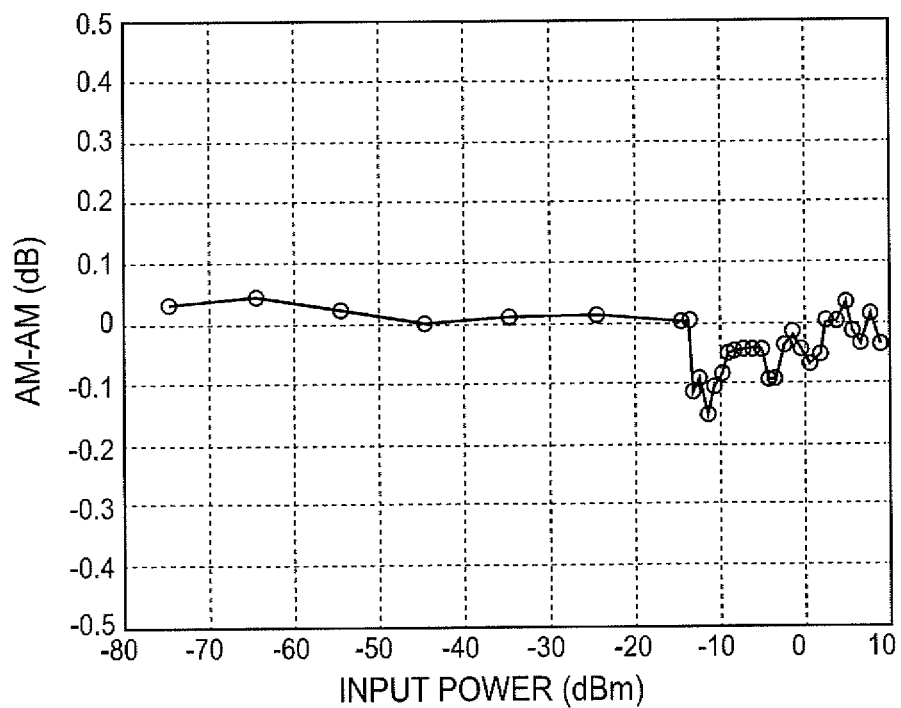
FIGS. 14A and 14B respectively depict gain error and phase error vs. input power for the amplifier circuit comprising the components of FIGS. 1, 3, and 7.
Figure 14B:
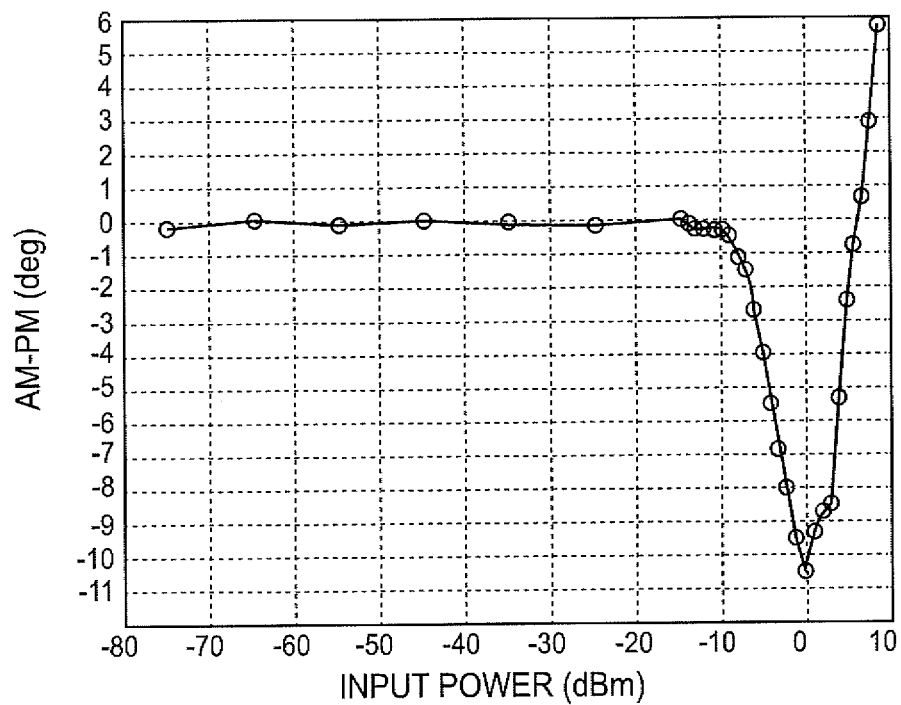

Lastly, FIGS. 14A and 14B depict the linearity of the gain error and phase error, which was measured in a static fashion over the WCDMA output power range of approximately 80 dB. As shown in FIG. 14A, the power amplifier circuit 100 has a gain error of 0.2 dB over the entire range and linear gain during class AB operations. For the AM-PM conversion (FIG. 14B), which represents how much the phase changes when the amplitude changes, the total phase error is 17° over the entire output power range. The total error (both AM-AM and AM-PM) in the power amplifier is within a range of pre-distortable values.

Figure 15A:
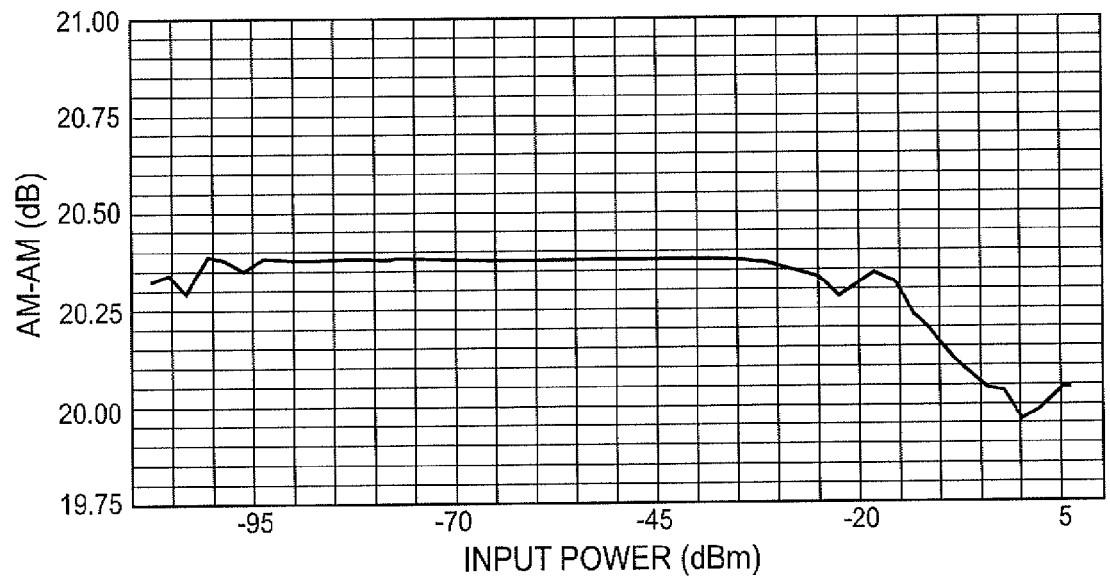
FIGS. 15A and 15B respectively depict gain error and phase error vs. output power for the amplifier circuit comprising the components of FIGS. 1, 4, and 7.
Figure 15B:
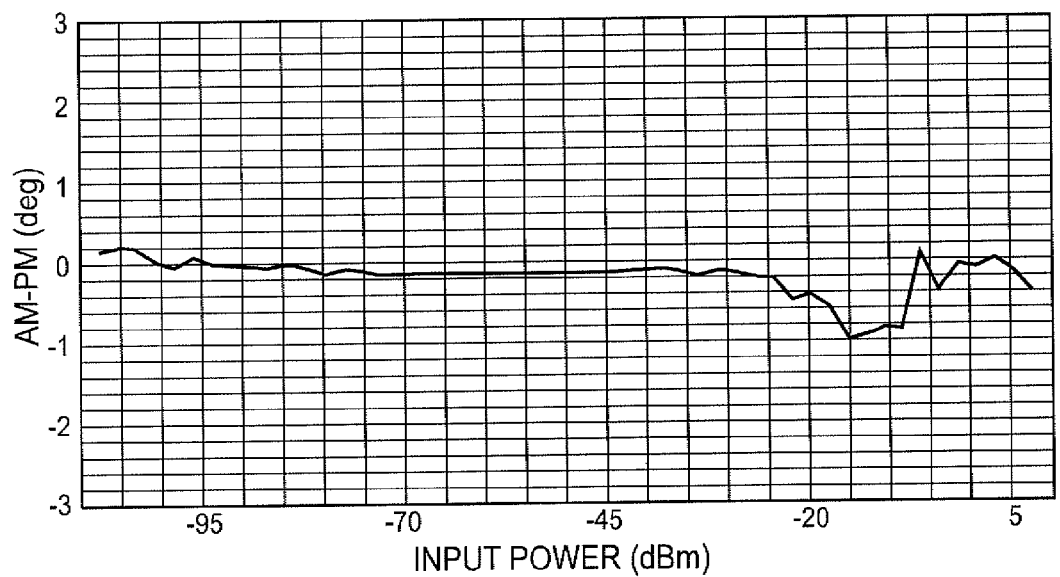

FIGS. 15A and 15B depict linearity performance results for the power amplifier comprising the power amplifier circuit 100 of FIG. 1, the RF current generator 130 of FIG. 4, and the matching network 200 of FIG. 7. FIG. 15A demonstrates that the gain error degrades slightly when the transconductance amplifier replaces the injection transistor embodiment of the RF current generator 130, but the total phase error improves to roughly 1° (FIG. 15B). Again, the total error (both AM-AM and AM-PM) in the power amplifier is within pre-distortable values.

Figure 16A:
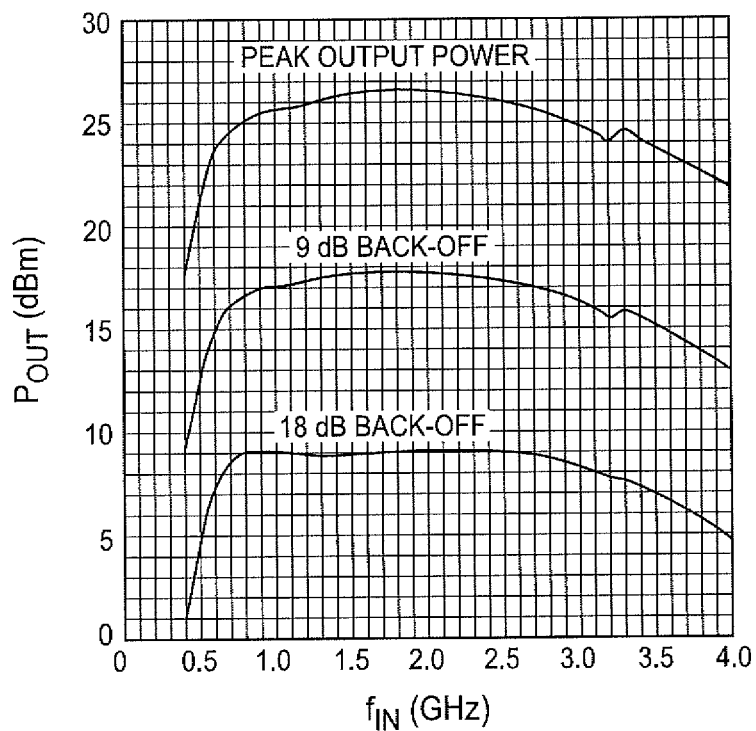
FIGS. 16A and 16B respectively depict output power and PAE vs. frequency for the amplifier circuit comprising the components of FIGS. 1, 4, and 8.
Figure 16B:
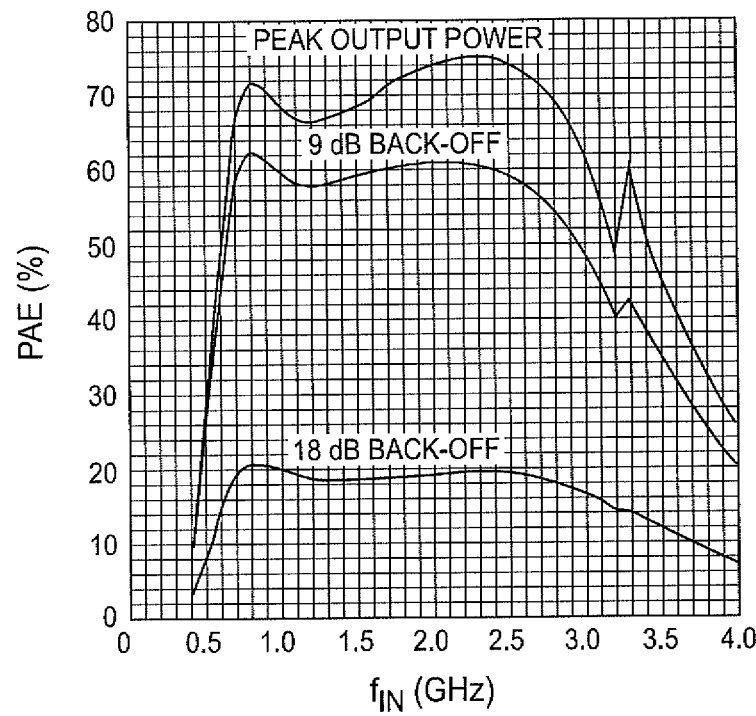

FIGS. 16A and 16B depict the frequency response for the output power and PAE for the power amplifier comprising the power amplifier circuit 100 of FIG. 1, the RF current generator 130 of FIG. 4, and the matching network 200 of FIG. 8. At peak output power, FIG. 16A demonstrates that the −3 dB bandwidth of the power amplifier circuit 100 is 2.0 GHz (between 0.6 and 3.6 GHz). FIG. 16A further demonstrates that the bandwidth stays the same or increases for lower input powers. Further, FIG. 16B demonstrates that the PAE at the peak output power is above 50% between 0.6 GHz and 3.4 GHz. When the output power is backed off by 18 dB, the PAE is at a constant value of approximately 20% for frequencies between 0.7 and 2.5 GHz.

The power amplifier circuit disclosed herein comprises an RF switched-mode power amplifier (SMPA). In an RF SMPA, switching typically dominates the losses, e.g., from power dissipation due to charging and discharging capacitances between the supply and ground. By using a tuned circuit, e.g., an LC-oscillator, the reactive energy may alternate between capacitors and inductors in the matching network 200, rather than all of it being dissipated in the switch resistances every RF cycle. Some losses remain, however, due to losses of inductors and capacitors, and due to the non-zero currents and voltages in both the cascode transistors 112 and the switching transistors 122. In order to reduce these losses, the capacitance may be minimized, resulting in a low tank Q when connected to the resistive output load, and a wide bandwidth. For example, by integrating the cascode capacitances into the matching network 200, as shown in FIGS. 1 and 7 or 8, the losses can be reduced.

The power amplifier circuit 100 disclosed herein may be implemented in the STMicroelectronics 65 nm CMOS process with eight metal layers and MIM capacitors. In one exemplary embodiment, the cascade transistors 112 may be implemented using thick oxide 2.5 V I/O devices. In one exemplary layout, all transistors are drawn in a common-centroid layout to minimize mismatch. Because the area of each individual transistor is also large, the resulting mismatch is small. In one implementation, the resulting chip has a chip area of 0.52×0.48 mm$^2$, including pads.

It will be appreciated that the power amplifier circuit 100 disclosed herein provides a single-stage amplifier solution using 65 nm CMOS to achieve, in one embodiment, a 2 GHz bandwidth, 29 dBm output power, 20.5 dB gain, and 64% PAE. Such performance results are as good as some past multiple stage solutions, and generally are better than most past amplifier solutions.

Figure 17:
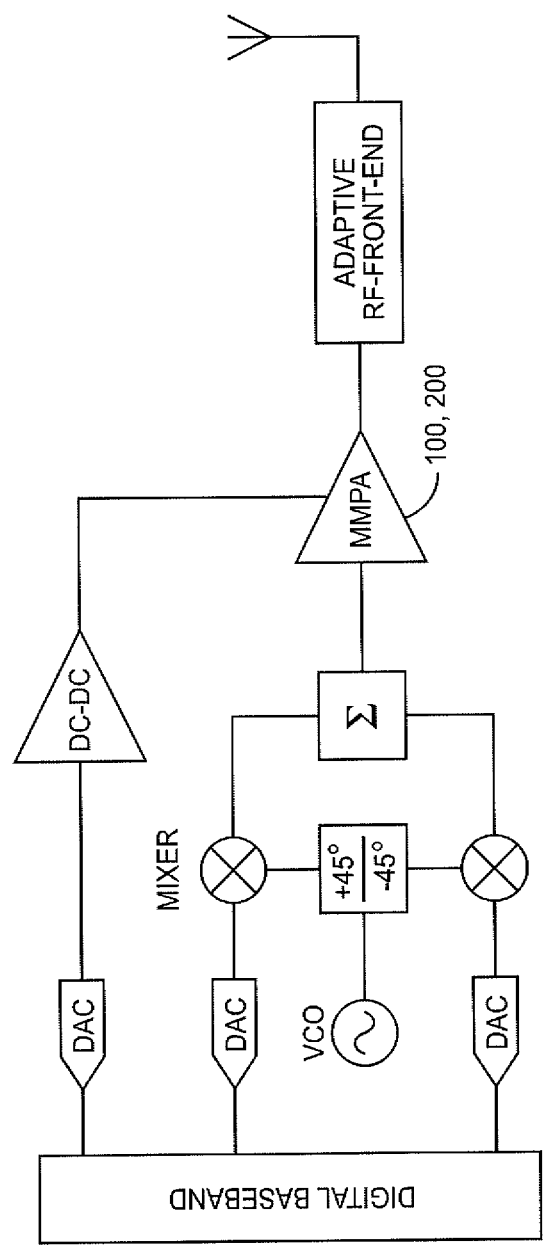
FIG. 17 depicts an exemplary transmitter application for the power amplifier disclosed herein.

While not required, the power amplifier 100 and matching network 200 disclosed herein may be used in a Hybrid-Envelope Elimination and Restoration (H-EER) system, such as shown in FIG. 17, where the amplifier operates as a Mixed-Mode Power Amplifier (MMPA). In this example, MMPA refers to the operation of the amplifier as a self-oscillating Switched-Mode Power Amplifier (SMPA) for high output power levels, and as a linear class AB power amplifier for low output power levels, e.g., when the power amplifier is not the main power consumer. This increases the power range of the system, overcoming one of the key issues of SMPAs, which is their poor power range. Such improvements are important for WCDMA operation, which has a power control range of 80 dB.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A power amplifier circuit comprising:
    a current generator configured to generate a radio frequency differential injection current at differential current generator outputs based on an input signal;
    a pair of cross-coupled switching transistors, each including a source node, a gate node, and a drain node, said pair of switching transistors cross-coupled such that the drain node of each one of the switching transistors couples to the gate node of the other switching transistor, wherein the drain nodes are coupled to the differential current generator outputs;
    a pair of cross-coupled cascode transistors, each including a source node, a gate node, and a drain node, said pair of cascode transistors cross-coupled such that the drain node of each one of the cascode transistors couples to the gate node of the other cascode transistor via a corresponding one of first and second tap capacitors, wherein the source nodes of the cascode transistors couple to corresponding ones of the drain nodes of the switching transistors and to the differential current generator outputs, and wherein said pair of cross-coupled cascode transistors is configured to generate a differential amplified output signal at the drain nodes of the cascode transistors based on a supply voltage operatively coupled to the drain node of the cascode transistors and the differential injection current.

2. The amplifier circuit of claim 1 wherein the input signal comprises an analog radio frequency differential input voltage signal and the current generator comprises a pair of injection transistors, each comprising a source node, a gate node, and a drain node, wherein the drain node of each injection transistor couples to the drain node of a corresponding one of the switching transistors and to the source node of a corresponding one of the cascode transistors, and wherein the source nodes of each injection transistor couples to the source node of a corresponding one of the switching transistors, said injection transistors configured to convert the differential input voltage signal applied to the gate nodes of the injection transistors to the differential injection current output at the drain nodes of the injection transistors.

3. The amplifier circuit of claim 1 wherein the input signal comprises a baseband differential input signal and the current generator comprises a mixer configured to generate the differential injection current based on the baseband differential input signal.

4. The amplifier circuit of claim 3 wherein the mixer comprises a Quadrature mixer and the input signal comprises a baseband In-phase differential input signal and a baseband Quadrature-phase differential input signal, said Quadrature mixer configured to generate the differential injection current based on a Quadrature-phase radio frequency local oscillator signal, an In-phase radio frequency local oscillator signal, and the baseband In-phase and Quadrature-phase differential input signals.

5. The amplifier circuit of claim 3 wherein the input signal comprises an analog baseband differential input signal and the mixer comprises a transconductance mixer including a pair of first baseband transistors, a pair of second baseband transistors, and a pair of local oscillator transistors, wherein said transconductance mixer is configured to generate the differential injection signal based on the baseband differential input signal and a radio frequency differential local oscillator signal.

6. The amplifier circuit of claim 5 wherein drain nodes of the local oscillator transistors couple to corresponding source nodes of the first baseband transistors and corresponding source nodes of the second baseband transistors, the differential local oscillator signal is applied to gate nodes of the local oscillator transistors, the differential input signal is applied to gate nodes of the first baseband transistors, the source nodes of the first baseband transistors couple to the corresponding source nodes of the second baseband transistors, drain nodes of the first baseband transistors output the differential injection current, and the drain nodes of the first baseband transistors cross-couple with drain nodes of the second baseband transistors.

7. The amplifier circuit of claim 3 wherein the input signal comprises a digital baseband input signal and the mixer comprises a radio frequency digital-to-analog converter configured to generate the differential injection current based on the digital baseband input signal and a radio frequency local oscillator signal.

8. The amplifier circuit of claim 1 wherein the switching transistors are configured to amplify the differential injection current to apply an amplified differential injection current to the source nodes of the cascode transistors.

9. The amplifier circuit of claim 1 further comprising a matching unit configured to match a load of the amplifier circuit to an external circuit.

10. The amplifier circuit of claim 9 wherein said matching unit is further configured to provide a generally constant impedance to the drain nodes of the cascode transistors across a wideband frequency range.

11. The amplifier circuit of claim 9 wherein the matching unit comprises:
    a first reactance unit comprising two or more inductors serially coupled between a signal ground and the drain node of one cascode transistor and between the signal ground and the drain node of the other cascode transistor, said first reactance unit configured to generate a first positive reactance at low frequencies and a second positive reactance at high frequencies;

a second reactance unit comprising at least one series capacitor and at least one series inductor serially coupled between a resistor and the drain node of each of the cascode transistors, said second reactance unit configured to generate a negative reactance at low frequencies and a third positive reactance at high frequencies; and a third reactance unit comprising at least one control capacitor coupled at one node between the resistor and the series capacitor of the second reactance unit and at the other node between the inductors of the first reactance unit, said third reactance unit configured to generate a short at high frequencies so as to reduce a parasitic capacitance at the drain nodes of the cascode transistors at high frequencies, wherein said first, second, and third reactance units operate together to provide the generally constant impedance across the wideband frequency range.

12. The amplifier circuit of claim 11 wherein the signal ground corresponds to the supply voltage.

13. The amplifier circuit of claim 1 wherein the cascode transistors comprise one of laterally diffused metal oxide semiconductor transistors and extended drain metal oxide semiconductor transistors, and wherein the switching transistors comprise one of CMOS, BiCMOS, HBT, and III-V (Bipolar and FET) transistor technologies.

14. The amplifier circuit of claim 1, wherein said first and second tap capacitors have a capacitance selected to control an amplitude of a gate signal at the gate nodes of the cascode transistors to substantially equal an amplitude of a source signal at the corresponding source nodes of the cascode transistors, or to differ from the amplitude of the source signal at the corresponding source node by no more than 50%.

15. The amplifier circuit of claim 1 wherein the amplifier circuit comprises a wideband CMOS power amplifier circuit.

16. A matching unit configured to match a load of an amplifier circuit to an external circuit, said matching unit comprising:

a first reactance unit comprising two or more inductors serially coupled between a signal ground and a first output of the amplifier circuit and between the signal ground and a second output of the amplifier circuit, said first reactance unit configured to generate a first positive reactance at low frequencies and a second positive reactance at high frequencies;

a second reactance unit comprising at least one series capacitor and at least one series inductor serially coupled between a resistor and the first and second outputs of the amplifier, said second reactance unit configured to generate a negative reactance at low frequencies and a third positive reactance at high frequencies; and a third reactance unit comprising at least one control capacitor coupled at one node between the resistor and the series capacitor of the second reactance unit and at the other node between the inductors of the first reactance unit, said third reactance unit configured to generate a short at high frequencies so as to reduce a parasitic capacitance at the first and second outputs of the amplifier at high frequencies, wherein said first, second, and third reactance units operate together to provide the generally constant impedance across the wideband frequency range.

17. The matching unit of claim 16 wherein the signal ground corresponds to a supply voltage.

* * * * *

UNITED STATES PATENT AND TRADEMARK OFFICE
CERTIFICATE OF CORRECTION

PATENT NO. : 8,554,162 B2
APPLICATION NO. : 13/197022
DATED : October 8, 2013
INVENTOR(S) : Lindstrand et al.

It is certified that error appears in the above-identified patent and that said Letters Patent is hereby corrected as shown below:

On the Title Page, in Item (57), under "ABSTRACT", in Column 2, Line 2, delete "cascade" and insert -- cascode --, therefor.

On the Title Page, in Item (57), under "ABSTRACT", in Column 2, Line 6, delete "cascade" and insert -- cascode --, therefor.

In The Specification

In Column 3, Line 65, delete "cascade" and insert -- cascode --, therefor.

In Column 4, Line 20, delete "cascade" and insert -- cascode --, therefor.

In Column 4, Line 23, delete "RE" and insert -- RF --, therefor.

In Column 4, Line 61, delete "RE" and insert -- RF --, therefor.

In Column 5, Line 36, delete "Cascade" and insert -- Cascode --, therefor.

In Column 5, Line 49, delete "cascade" and insert -- cascode --, therefor.

In Column 5, Line 53, delete "cascade" and insert -- cascode --, therefor.

In Column 5, Line 59, delete "cascade" and insert -- cascode --, therefor.

In Column 5, Line 64, delete "cascade" and insert -- cascode --, therefor.

In Column 6, Line 19, delete "cascade" and insert -- cascode --, therefor.

In Column 8, Line 62, delete "cascade" and insert -- cascode --, therefor.

Signed and Sealed this
Nineteenth Day of April, 2016

Michelle K. Lee
*Director of the United States Patent and Trademark Office*

In Column 9, Line 1, delete "cascade" and insert -- cascode --, therefor.

In The Claims

In Column 11, Line 33, in Claim 14, delete "cascade" and insert -- cascode --, therefor.

In Column 11, Line 35, in Claim 14, delete "cascade" and insert -- cascode --, therefor.